(12) United States Patent
Miller, Jr.

(10) Patent No.: US 7,268,597 B2
(45) Date of Patent: Sep. 11, 2007

(54) SELF-INITIALIZING FREQUENCY DIVIDER

(75) Inventor: Robert H Miller, Jr., Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 245 days.

(21) Appl. No.: 11/058,767

(22) Filed: Feb. 16, 2005

(65) Prior Publication Data

US 2006/0181316 A1     Aug. 17, 2006

(51) Int. Cl.
*H03B 19/00* (2006.01)
(52) U.S. Cl. ....................... 327/117; 327/115
(58) Field of Classification Search ............. None
See application file for complete search history.

(56) References Cited

U.S. PATENT DOCUMENTS

| | | | | |
|---|---|---|---|---|
| RE32,605 E | * | 2/1988 | Yamashita et al. | 377/47 |
| 5,425,074 A | * | 6/1995 | Wong | 377/47 |
| 5,867,068 A | * | 2/1999 | Keating | 331/1 A |
| 5,948,046 A | * | 9/1999 | Hagberg | 708/103 |
| 6,031,425 A | * | 2/2000 | Hasegawa | 331/1 A |
| 6,282,255 B1 | * | 8/2001 | La Rosa et al. | 377/47 |
| 6,313,673 B1 | * | 11/2001 | Watanabe | 327/115 |
| 6,535,569 B2 | * | 3/2003 | Nakajima et al. | 377/122 |
| 6,661,864 B2 | * | 12/2003 | Ishiwaki | 377/28 |
| 6,970,025 B2 | * | 11/2005 | Magoon et al. | 327/115 |

* cited by examiner

*Primary Examiner*—Timothy P. Callahan
*Assistant Examiner*—Cassandra Cox

(57) ABSTRACT

A frequency divider apparatus is a closed loop system of a recirculating memory element, at least one feedback memory element and an end memory element in series combination. Each memory element accepts a common clock. An end memory element output is logically combined with at least one of the other memory element outputs and provides an input to the closed loop system to generate a self-initializing state machine.

7 Claims, 7 Drawing Sheets

SELF-INITIALIZING FREQUENCY DIVIDER

BACKGROUND

Frequency divider circuits are useful in many digital circuit designs. Many conventional frequency dividers require a reset operation to ensure that the divider circuit is placed in a legal state after which it will divide as expected. Reset signals are typically synchronized with the clock signal. Accordingly, there is some level of complication when a control machine that is operating without benefit of the clock it is trying to reset must generate a clear synchronous reset signal. For high frequency clocks, the problem becomes even more complicated because the reset must occur within a period of the clock. Propagation delay through the circuit generating the reset signal is likely to be on the order of a clock period or longer for high frequency clocks. Self-initializing circuits do not require a reset signal for proper operation. There is a need, therefore, for a self-initializing frequency divider suitable for high frequency clocks.

BRIEF DESCRIPTION OF THE DRAWINGS

An understanding of the present teachings can be gained from the following detailed description, taken in conjunction with the accompanying drawings of which.

DETAILED DESCRIPTION

Figure 1:
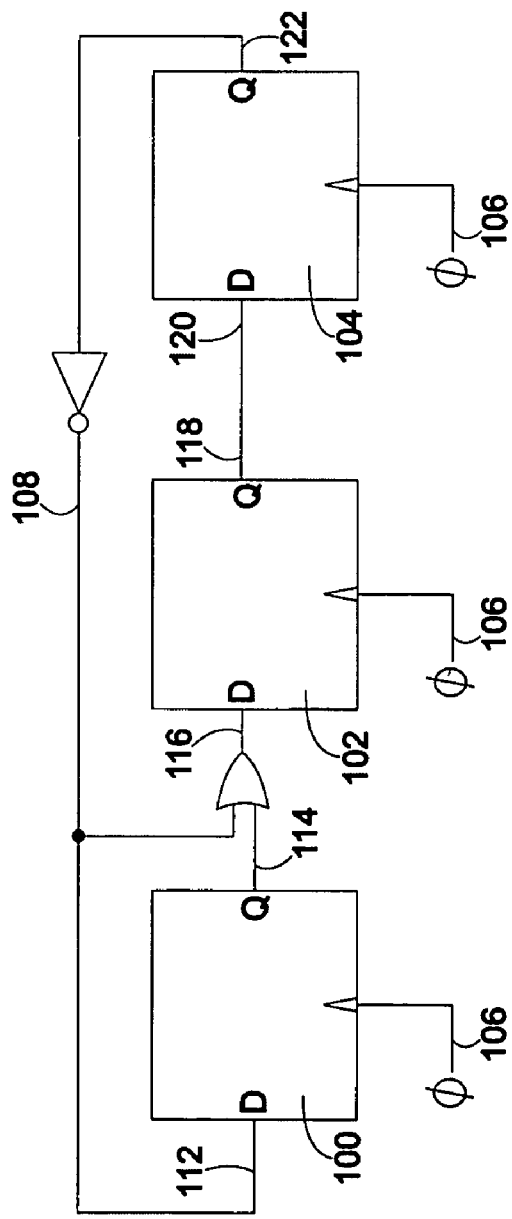
FIGS. 1 and 2 illustrate a circuit schematic of an embodiment of a divide by five frequency divider according to the present teachings and its associated timing diagram.

With specific reference to FIG. 1 of the drawings, there is shown a divide by five frequency divider. The frequency divider of FIG. 1 comprises a series combination of a re-circulating memory element 100, a feedback memory element 102, and a an end memory element 104. Each of the memory elements comprises an edge-sensitive D-Q flip flop and accepts a common clock 106. An inverted end memory element output 108 is received by a re-circulating memory element input 112. A re-circulating memory element output 114 is disjunctively combined with the inverted end memory element output 108 and received by feedback memory element input 116. Feedback memory element output 118 is received by end memory element input 120. A circuit according to FIG. 1 has the following truth table for the re-circulating memory element output 114, the feedback memory element output 118, and the end memory element output 122, if the memory elements power up in the "000" state:

TABLE 1

| Clock cycle | State |
| --- | --- |
| 1 | 000 |
| 2 | 110 |
| 3 | 111 |
| 4 | 011 |
| 5 | 001 |
| 6 | 000 |
| 7 | 110 |
| 8 | 111 |
| 9 | 011 |
| 10 | 001 |
| 11 | 000 |

Figure 2:
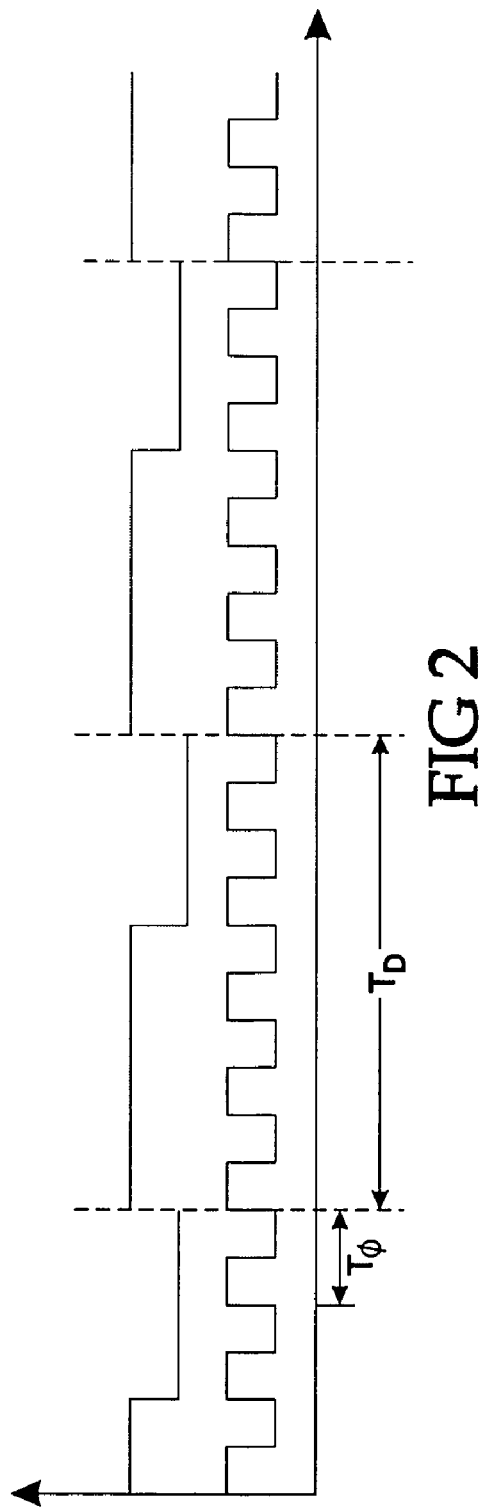

As one of ordinary skill in the art appreciates from the truth table, any one of the memory element outputs 114, 118, 122, produce a signal that divides the common clock signal by five. With specific reference to FIG. 2, a period of the common clock 106 is shown as $T_\phi$ and a period of the divided clock is shown as $T_D$. Accordingly a period of any one of the memory element outputs 114, 118, 122 is five times the period of the common clock and generates a rising edge for every $5^{th}$ rising edge of the common clock 106. The frequency divider of FIG. 1 is a self-initializing frequency divider. Referring to Table 1, it is apparent that there are three undefined states. Specifically, the undefined states are 010, 100, 101. If the frequency divider of FIG. 1 powers up in the 010 state, the next state is 111, which is a defined state. Accordingly, the frequency divider eventually reaches a defined state and remains within the pattern of Table 1 without benefit of a circuit reset. Similarly, state 100 transitions to the defined state 110. Undefined state 101 transitions to undefined state 010, which transitions to defined state 111. Accordingly, all undefined states eventually transition to defined states without benefit of a reset signal and its associated circuitry. Once the circuit reaches one of the defined states, all later states are also defined and the frequency divider provides a clean divided signal.

Figure 3:
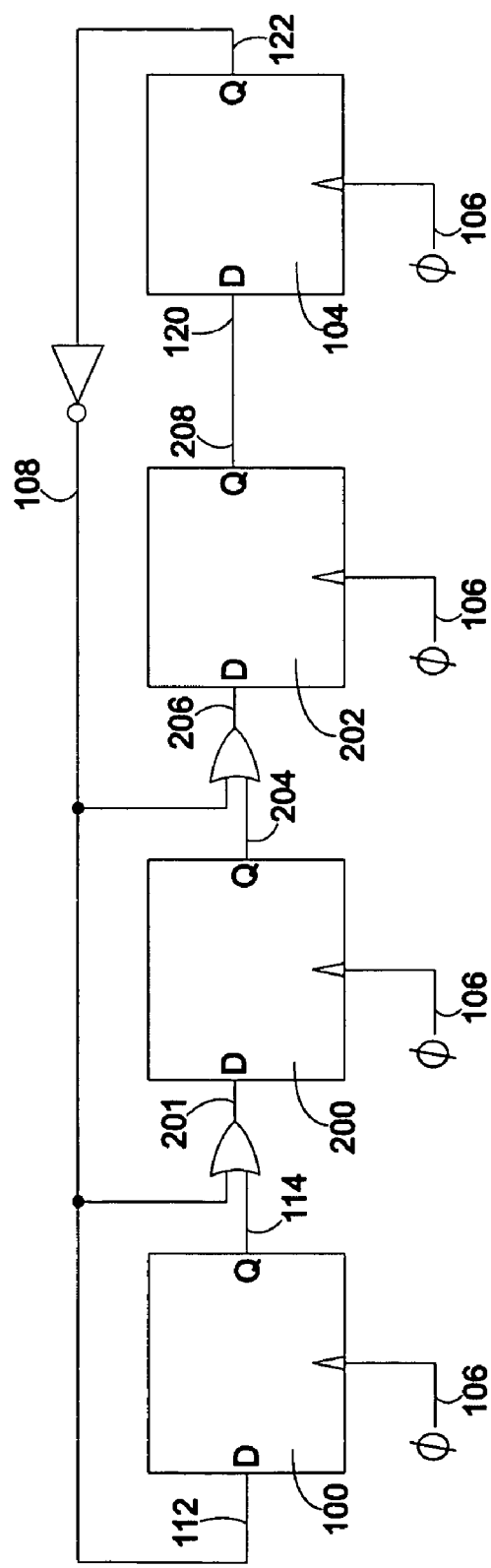
FIGS. 3 and 4 illustrate a circuit schematic of an embodiment of a divide by six frequency divider according to the present teachings and its associated timing diagram.

With specific reference to FIG. 3 of the drawings, there is shown another embodiment of a frequency divider according to the present teachings that takes the circuit of FIG. 1 and adds another feedback memory element in series combination between the re-circulating memory element 100 and the end memory element 104. The embodiment of FIG. 3 divides the common clock frequency by six. The frequency divider of FIG. 3 comprises a series combination that includes the re-circulating memory element 100, first and second feedback memory elements 200 and 202, and the end memory element 104. The inverted end memory element output 108 is received by the re-circulating memory element input 112. The re-circulating memory element output 114 is disjunctively combined with the inverted end memory element output 108 and received by the first feedback memory element input 201. First feedback memory element output 204 is disjunctively combined with the inverted end memory element output 108 and received by second feedback memory element input 206. Second feedback memory element output 208 is received by end memory element input 120. A circuit according to FIG. 1 has the following truth table for the re-circulating memory element output 114, the first and second feedback memory element outputs 204, 208 and the end memory element output 122, if the memory elements power up in the "0000" state:

TABLE 2

| Clock cycle | State |
|---|---|
| 1 | 0000 |
| 2 | 1110 |
| 3 | 1111 |
| 4 | 0111 |
| 5 | 0011 |
| 6 | 0001 |
| 7 | 0000 |
| 8 | 1110 |
| 9 | 1111 |
| 10 | 0111 |
| 11 | 0011 |
| 12 | 0001 |
| 13 | 0000 |

Figure 4:
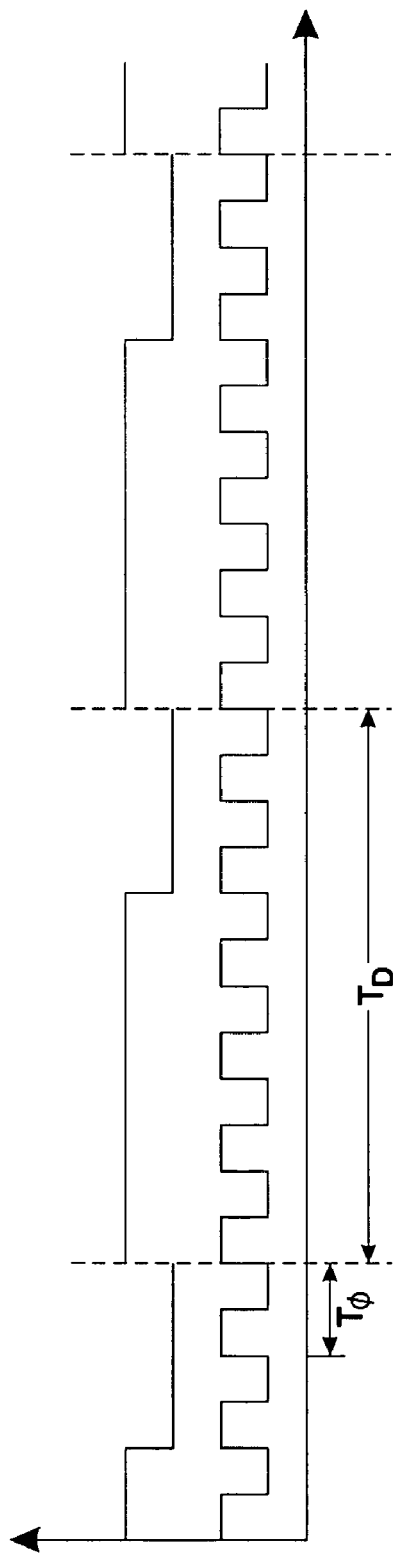

As one of ordinary skill in the art appreciates from the truth table shown as Table 2, any one of the memory element outputs 114, 204, 208, 122, produces a signal that divides the common clock signal by six as shown in FIG. 4. Accordingly a period of any one of the memory element outputs 114, 204, 208, 122 is six times the period of the common clock 106 and generates a rising edge for every $6^{th}$ rising edge of the common clock. The frequency divider of FIG. 3 is a self-initializing frequency divider. Referring to Table 2, it is apparent that there are six defined states and ten undefined states. Specifically, the undefined states are 0010, 0100, 0101, 0110, 1000, 1001, 1010, 1011, 1100, and 1101. If the frequency divider of FIG. 3 powers up in any of the undefined states, it will eventually transition to one of the defined states. For example, the undefined states of 0010, 0110, and 1010 transition directly to the defined state 1111. The undefined states of 0100, 1000, and 1100 transition to the defined 1110 state. Undefined states 0101 and 1101 transition to defined state 1111 through undefined states 0010 and 0110, respectively. Undefined state 1001 transitions to undefined state 0100 and then defined state 1110 and undefined state 1011 transitions through undefined states 0101 and 0010 before transitioning to defined state 1111. Accordingly, the frequency divider of FIG. 3 eventually reaches a defined state and remains within the pattern of Table 2 without benefit of a circuit reset.

Figure 5:
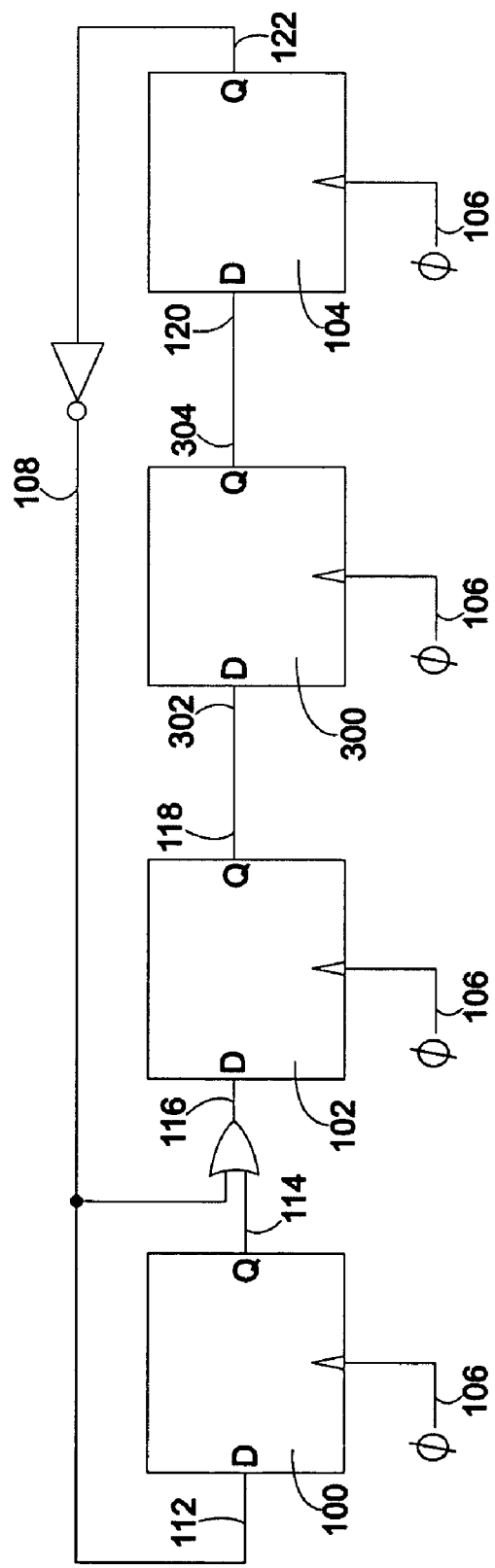
FIGS. 5 and 6 illustrate a circuit schematic of an embodiment of a divide by seven frequency divider according to the present teachings and its associated timing diagram.
Figure 6:
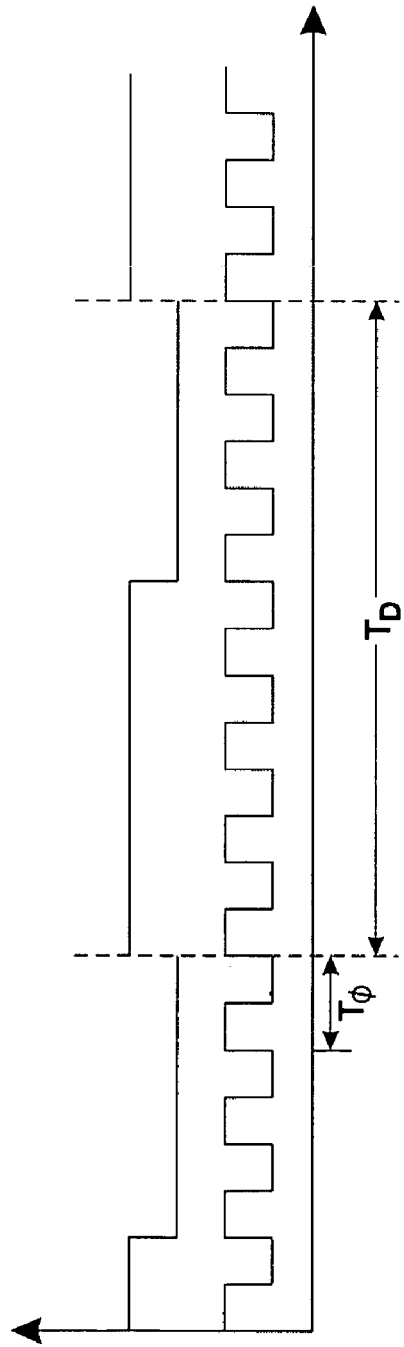

With specific reference to FIGS. 5 and 6 of the drawings, there is shown another embodiment of a frequency divider according to the present teachings that takes the circuit of FIG. 3 and replaces the second feedback memory element 202 with a pass memory element 300. The pass memory element 300 is different from the feedback element 202 in that the pass memory element receives just the output of the adjacent element at its input rather than the disjunctive combination of the inverse of the end memory element output 108 and the adjacent memory element output. The embodiment of FIG. 5 divides the common clock frequency by seven. The frequency divider of FIG. 5 comprises a series combination of the re-circulating memory element 100, the feedback memory elements 102, the pass memory element 300, and the end memory element 104. The inverted end memory element output 108 is received by the re-circulating memory element input 112. The re-circulating memory element output 114 is disjunctively combined with the inverted end memory element output 108 and received by the feedback memory element input 116. The feedback memory element output 118 is received by pass memory element input 302. The pass memory element output 304 is received by end memory element input 120. A circuit according to FIG. 5 has the following truth table for the re-circulating memory element output 114, the feedback memory element outputs 118, the pass memory element 304, and the end memory element output 122, if the memory elements power up in the "0000" state:

TABLE 3

| Clock cycle | state |
|---|---|
| 1 | 0000 |
| 2 | 1100 |
| 3 | 1110 |
| 4 | 1111 |
| 5 | 0111 |
| 6 | 0011 |
| 7 | 0001 |
| 8 | 0000 |
| 9 | 1100 |
| 10 | 1110 |
| 11 | 1111 |
| 12 | 0111 |
| 13 | 0011 |
| 14 | 0001 |
| 15 | 0000 |

As one of ordinary skill in the art appreciates from the truth table shown as Table 3, any one of the memory element outputs 114, 118, 304, and 122, produces a signal that divides the common clock signal by seven as shown in FIG. 6. Accordingly a period of any one of the memory element outputs 114, 118, 304, 122 is seven times the period of the common clock 106 and generates a rising edge for every $7^{th}$ rising edge of the common clock. The frequency divider of FIG. 5 is a self-initializing frequency divider. Referring to Table 3, it is apparent that there are seven defined states and nine undefined states. Specifically, the undefined states are 0010, 0100, 0101, 0110, 1000, 1001, 1010, 1011, and 1101. If the frequency divider of FIG. 5 powers up in any of the undefined states, it will eventually transition to one of the defined states. For example, the undefined states of 0010, 0101, 0110, 1010, 1011, and 1101 transition directly or eventually to the defined state 1111. The remaining undefined states of 0100, 1000, and 1001 transition directly or eventually to the defined 1110 state. Accordingly, the frequency divider of FIG. 5 eventually reaches a defined state and remains within the pattern of Table 3 without benefit of a circuit reset.

Figure 7:
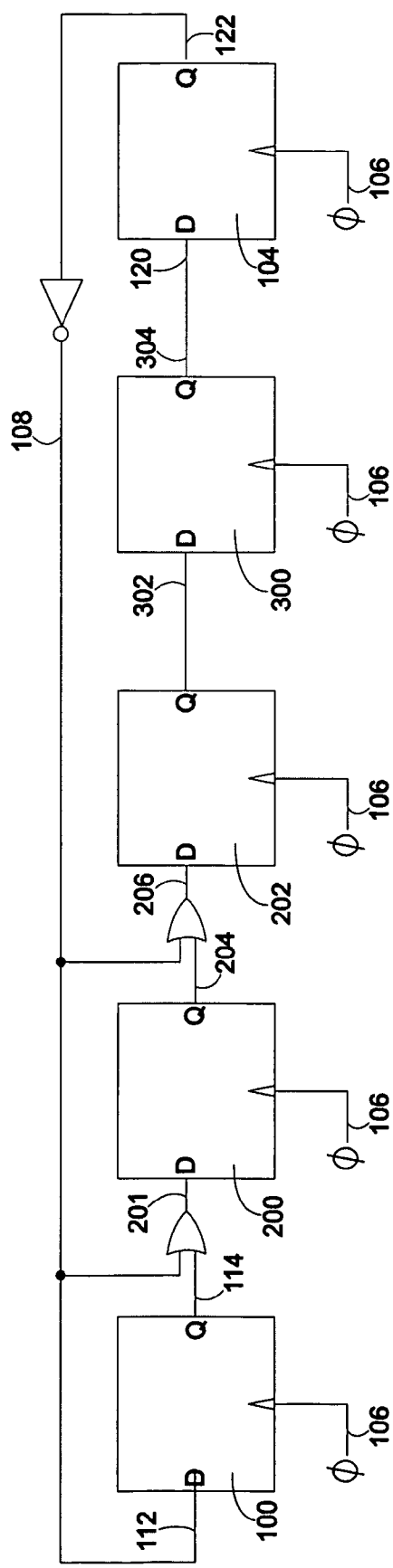
FIGS. 7 and 8 illustrate a circuit schematic of an embodiment of a divide by eight frequency divider according to the present teachings and its associated timing diagram.
Figure 8:
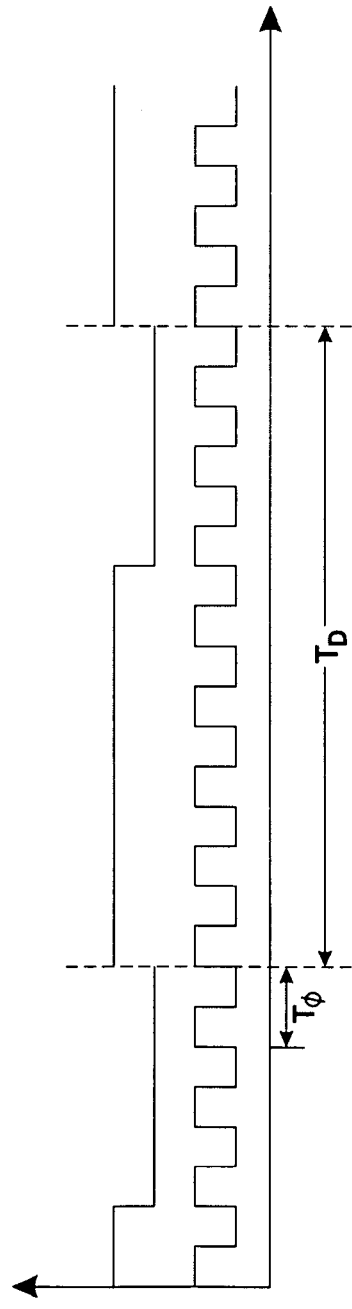

With specific reference to FIGS. 7 and 8 of the drawings, the teachings with respect to FIGS. 1 through 6 are applicable in an embodiment that divides the common clock by eight. The embodiment shown in FIG. 7 is adapted from the configuration of FIG. 5 and adds the second feedback memory element 202 between the first feedback memory element 200 and the pass memory element 300. In the divide by eight embodiment, there are five memory elements total; the re-circulating memory element 100, the first and second feedback memory elements 200, 202, the pass memory element 300 and the end memory element 104. The truth table for the embodiment of FIG. 7 is:

TABLE 3

| Clock cycle | State |
|---|---|
| 1 | 00000 |
| 2 | 11100 |
| 3 | 11110 |
| 4 | 11111 |

TABLE 3-continued

| Clock cycle | State |
| --- | --- |
| 5 | 01111 |
| 6 | 00111 |
| 7 | 00011 |
| 8 | 00001 |
| 9 | 00000 |
| 10 | 11100 |
| 11 | 11110 |
| 12 | 11111 |
| 13 | 00111 |
| 14 | 00011 |
| 15 | 00000 |

A timing diagram for any one of the memory element outputs relative to the common clock signal is shown in FIG. 8 of the drawings. In this embodiment, there are eight defined states, because it is a divide by eight frequency divider, and twenty-four undefined states. If the frequency divider powers up in any of the undefined states, the circuit eventually transitions to one of the defined states where it then remains within the pattern shown in FIG. 8 of the drawings.

Figure 11:
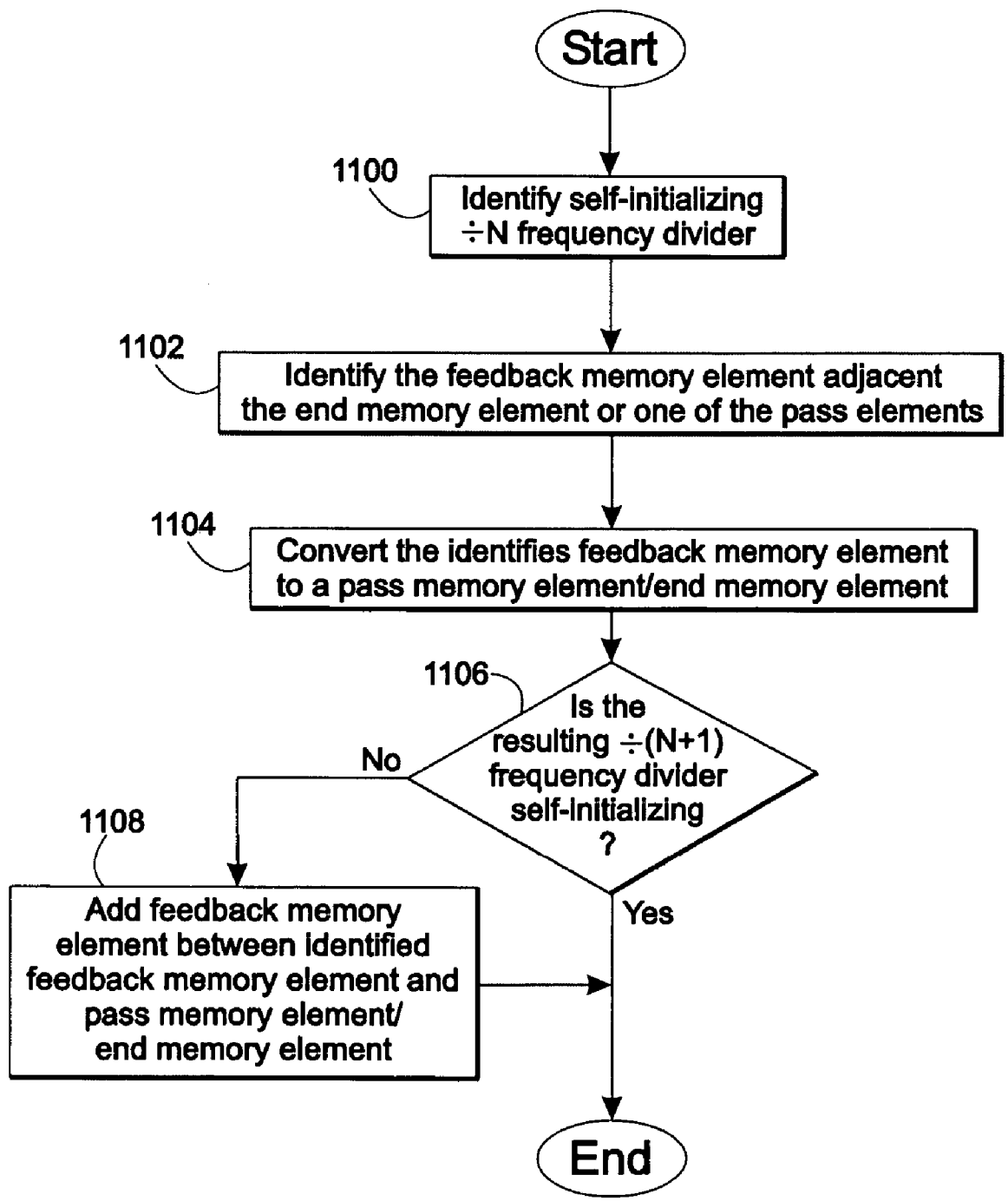
FIG. 11 is a flow chart of a process according to the present teachings.

The teachings relevant to FIGS. 1 through 8 of the drawings may be adapted to create a self-initializing divide by N frequency divider. With specific reference to FIG. 11 of the drawings, a process according to the present teachings is used to create a divide by N+1 frequency divider. Beginning 1100 with a known self-initializing divide by N frequency divider, a first step is to identify 1102 the specific feedback memory element adjacent to one of the pass elements 300 or, if no pass element is present, adjacent to the end memory element 104. The identified feedback memory element is then converted 1104 to a pass memory element. The resulting frequency divider configuration is then reviewed 1106 to determine if it is self-initializing. If so, the configuration is complete for the N+1 divide by N frequency divider. If the resulting configuration is not self-initializing, the divide by N frequency divider is adapted 1108 by adding an additional feedback memory element between the identified feedback element 202 and the pass memory element 300, if any, or the end memory element 104 if the divide by N frequency divider being adapted does not include the pass element 104. This final adaptation is the self-initializing divide by N+1 frequency divider.

Figure 9:
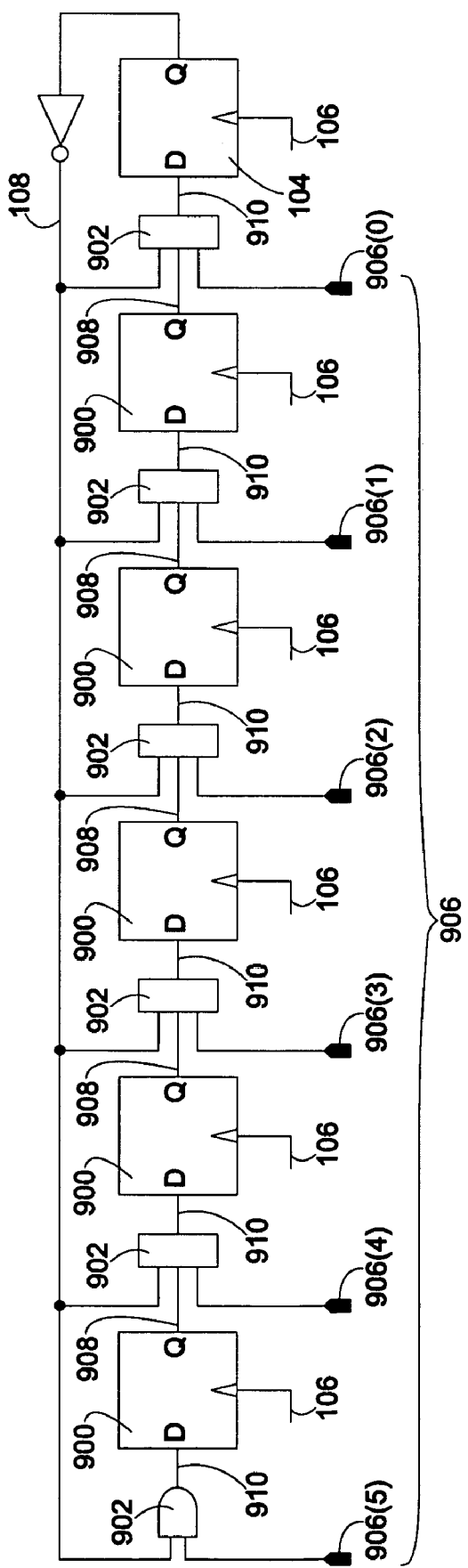
FIG. 9 illustrates a circuit schematic of an embodiment of a configurable frequency divider according to the present teachings that may be configured to implement the dividers of FIGS. 1 through 8.
Figure 10:
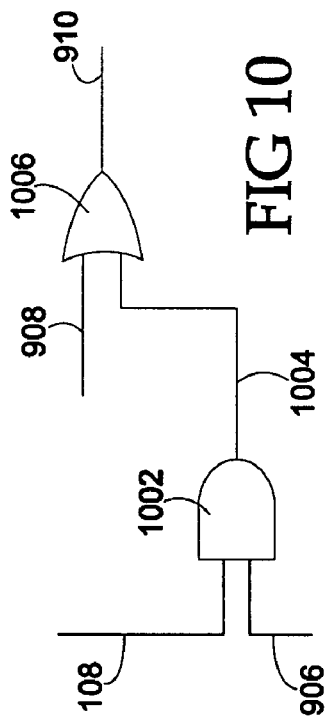
FIG. 10 is a schematic of a specific embodiment of a selection element used in the configurable frequency divider of FIG. 9.

With specific reference to FIG. 9 of the drawings, there is shown a configurable frequency divider according to the present teachings in which multiple memory elements 900 in series combination have selection elements 902 interposed therebetween and at an end of the frequency divider distal from the end memory element 104. Each memory element output 908 is received as one input to an adjacent selection element 902 and each selection element output 910 is received as an adjacent memory element input. The inverse of the end memory element output 108 is received by each selection element 902. Each of the memory elements 900 and the end memory element 104 is clocked by the common clock 106. A plurality of control bits 906 configures the frequency divider. Respective ones of the control bits 906 are received as one of the inputs to the selection elements 902 to configure the memory elements 902 as either the re-circulating memory element 100, one of the feedback memory elements 200,202, for example, or one of the pass memory elements. With specific reference to FIG. 10, there is shown an embodiment of logic appropriate for the selection element 902 according to the present teachings in which an AND gate 1002 receives the inverse of the end memory element output 108 and the respective control bit 906. An AND gate output 1004 and the adjacent memory element output 908 is received by an OR gate 1006. An output of the OR gate is the adjacent memory element input 910. Using the logic configuration illustrated, a "0" state in any one of the control bits removes the influence of the inverse of the end memory element output 108. Accordingly, a specific memory element 902 is configured as either the re-circulating memory element 100 or a pass memory element. Similarly, a "1" state in any one of the control bits permits the influence of the inverse of the end memory element output 108, thereby configuring the memory element 902 as one of the feedback memory elements 200, 202 as an example. The illustration of FIG. 9 shows six memory elements 900 in series combination. The present teachings however are applicable to embodiments with any number of memory elements 900 and selection elements 902 to generate higher frequency divide factors. Advantageously, the frequency divider of FIG. 9 is a reusable design useful for many different applications and configurable according to the frequency division needs of a circuit of which it is a part. As a further advantage, the configurable aspect of the apparatus of FIG. 9 permits external configuration of a self-initializing frequency divider. Configuration of the frequency divider of FIG. 9 may be done by hard wiring the control word to the desired logic value or providing external control inputs to provide in-circuit configurability.

Configuration of the illustration in FIG. 9 of the drawings as a divide by eight frequency divider as illustrated in FIG. 7 of the drawings uses the control word "011100", wherein the leftmost memory element illustrated in FIG. 9 is defined as the most significant bit of the control word that is made up of the control bits 906. As one of ordinary skill in the art appreciates, the highest value bit that is a "1" defines the memory element as the re-circulating memory element. Specifically, a "0" in the most significant control bit 906(5) renders the corresponding memory element as a pass element and functionally removes the memory element 902 from the frequency divider circuit. A "1" in the next most significant control bit 906(4) renders the corresponding memory element as the re-circulating memory element 100 for the divide by eight frequency divider. The next two most significant bits 906(3) and 906(2) as "1"s render the next two adjacent memory elements 900 as the feedback memory elements 200, 202. The next most significant bits 906(1) and 906(0) are "0"s to configure the corresponding memory elements as the pass memory element 300 and end memory element 104, respectively. Some control words will not configure the circuit shown in FIG. 9 as a self-initializing frequency divider circuits. For example, the following control words result a self-initializing frequency divider:

TABLE 5

| Frequency divide factor | Control word |
| --- | --- |
| 5 | 000110 |
| 6 | 001110 |
| 7 | 001100 |
| 8 | 01100 |
| 9 | 111100 |
| 10 | 111000 |

From the example, it is possible for one of ordinary skill in the art to recognize how self-initializing frequency dividers with different divide factors may be configured by applying the method according to the present teachings with benefit of the known self-initializing configurations and their frequency divide factors.

Figure 12:
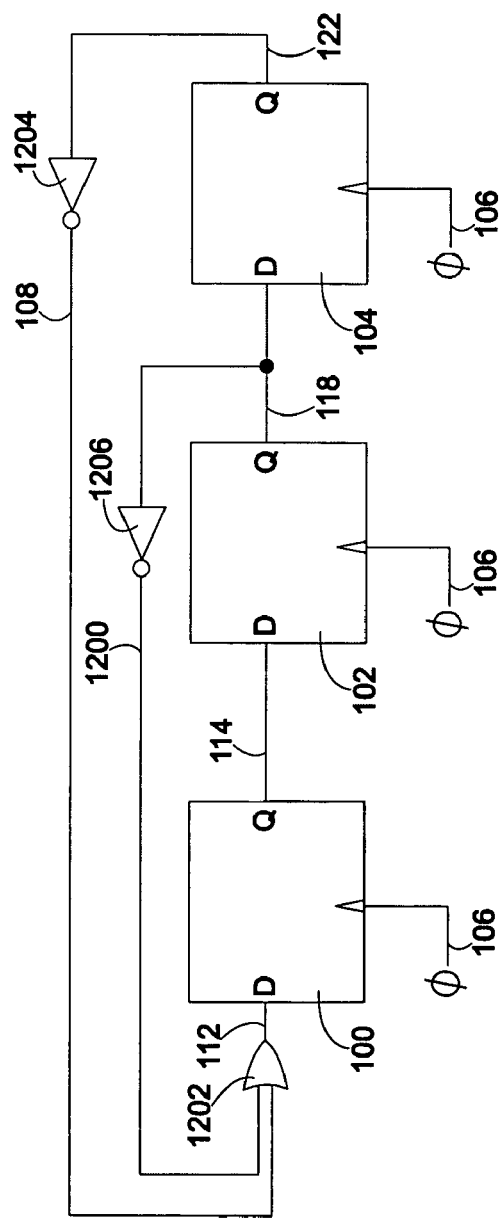
FIGS. 12 and 13 are schematics of alternative embodiments of a divide by five frequency divider according to the present teachings.

With specific reference to FIG. 12 of the drawings, there is shown an alternative embodiment of the divide by five frequency divider of FIG. 1. In the alternative embodiment, the re-circulating memory element 100, the feedback memory element 102 and the end memory element 104 remain in series combination. An inverse 1200 of the feedback memory element output 118 and the inverse of the end memory element output 108 are disjunctively combined at OR gate 1202. An output 1204 of the OR gate 1202 is received by the re-circulating memory element input 112. The truth table for the implementation of FIG. 12 is:

| Clock cycle | State |
|---|---|
| 1 | 111 |
| 2 | 011 |
| 3 | 001 |
| 4 | 100 |
| 5 | 110 |
| 6 | 111 |

Undefined states for the embodiment of FIG. 12 are "000", "010" and "101". Each of the defined states transition directly to defined state or through an undefined state to a defined state. The frequency divider of FIG. 12, therefore, is also self-initializing. The undefined states for FIG. 12 are different than the undefined states for FIG. 1, but the repetition after five states and the eventual transition to a defined state regardless of the power-up state are what make the circuit a self-initializing frequency divider.

From a mathematical point of view, the logic state at the re-circulating memory output 114 is represented as $s_0$, the logic state at the feedback memory element output 118 is represented as $s_1$, and the logic state at the end memory element output 122 is represented as $s_2$. For purposes of representing the circuit mathematically, a single clock period time delay function is represented as a $\delta$. In the frequency divider of FIG. 1:

$$s_1 = \partial(s_0 + \overline{s_2}) \tag{1}$$

and $$\partial s_0 = \partial^2 \overline{s_2} \tag{2}$$

The time delay function is distributive, therefore:

$$s_1 = \partial s_0 + \partial \overline{s_2} \tag{3}$$

Substituting equation (2) into equation (3) yields:

$$s_1 = \partial^2 \overline{s_2} + \partial \overline{s_2} \tag{4}$$

In the frequency divider of FIG. 12, and using the same mathematical nomenclature:

$$s_1 = \partial s_0 \tag{5}$$

$$s_2 = \partial s_1 \tag{6}$$

$$s_0 = \partial(\overline{s_2} + \overline{s_1}) \tag{7}$$

Substituting equation (7) into equation (5) yields:

$$s_1 = \partial^2(\overline{s_2} + \overline{s_1}) = \partial^2 \overline{s_2} + \partial^2 \overline{s_1} \tag{8}$$

Substituting equation (6) into equation (8) yields:

$$s_1 = \partial^2 \overline{s_2} + \partial s_2 \tag{9}$$

From a comparison of equations (4) and (9), it can be seen that the mathematical formulation of the two circuits is the same and the circuits, therefore are equivalent implementations of the same teachings.

Figure 13:
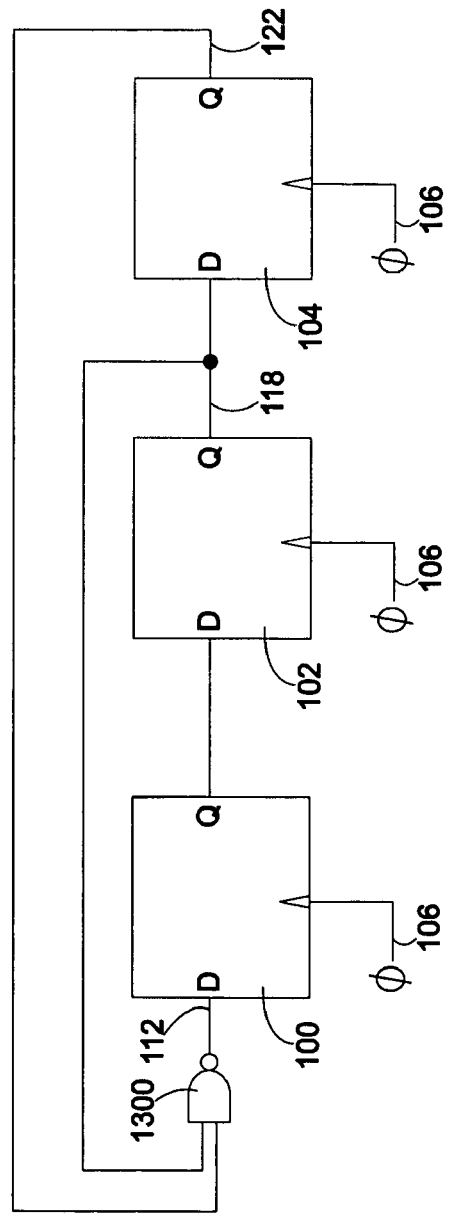

With specific reference to FIG. 13, there is shown a transformation of the circuit of FIG. 12 according to deMorgan's theorem and another embodiment of the divide by five self-initializing frequency divider of FIGS. 1 and 12. DeMorgan's theorem states that the complement of a conjunction is equal to the disjunction of the complements and vice versa. In symbols, the theorem is expressed as:

$$\text{not (x and y)} = (\text{not x}) \text{ or } (\text{not y}) \tag{5}$$

and may also be expressed as $$\text{not (x or y)} = (\text{not x}) \text{ and } (\text{not y}) \tag{6}$$

DeMorgan's theorem is extendable to logical equations with more than two factors as is known in the prior art.

The embodiment of FIG. 13 also includes the series combination of the re-circulating memory element 100, the feedback memory element 102 and the end memory element 104. The NOT 1204, 1206 and OR gates 1202 shown in FIG. 12 are converted to a NAND gate 1300 in the DeMorgan's transformation of FIG. 12 shown in FIG. 13. The end memory element output 122 and the feedback memory element output 118 are received by the inputs of the NAND gate 1300. An output of the NAND gate 1300 is received by the re-circulating memory element input 112.

Embodiments according to the present teachings are described by way of example to illustrate specific examples of that which are claimed. Specifically, equivalents of the frequency dividers of FIGS. 3, 5, 7, and 9 as well as larger embodiments according to the present teachings may also be generated using the mathematical equivalency and deMorgan's theorem transformations disclosed herein. Other embodiments and adaptations will occur to one of ordinary skill in the art given the present teachings and are considered within the scope of the appended claims.

The invention claimed is:

1. A frequency divider apparatus comprising:
a closed loop system with a re-circulating memory element, a first feedback memory element, a second feedback memory element coupled to an output of the first feedback memory element and an end memory element in series combination accepting a common clock, an inverse of the end memory element and an output of the re-circulating memory element being disjunctively combined and received by the first feedback memory element and the inverse of the end memory element and an output of the first feedback memory element being disjunctively combined and received by the second feedback memory element generate a self-initializing state machine.

2. A frequency divider apparatus as recited in claim 1 and further comprising at least one pass memory element in series combination between the second feedback element and the end memory element.

3. A frequency divider apparatus as recited in claim 1 and further comprising a plurality of pass memory elements disposed in series combination between the series combination of the first and second feedback memory elements and the end memory element.

4. A frequency divider apparatus as recited in claim 1 wherein the output of the re-circulating memory element is coupled to a selection element.

5. A frequency divider apparatus comprising:
a plurality of memory elements in series combination with respective selection elements interposed between the memory elements and an end memory element forming a closed loop system, each memory element configurable via a respective bit of a control word as a type of memory element selected from the group consisting of a re-circulating memory element, a feedback memory element, and a pass memory element, wherein each selection element comprises a disjunctive combination of a conjunctive combination of one of the respective control bits and an inverse of an end memory element output and an adjacent memory element output.

6. A frequency divider apparatus as recited in claim 5 wherein each selection element operates on one of the control bits, "C", an end memory element output, "B", and an adjacent memory element output, "A", wherein a selection element output follows the logical combination of A*(B+C).

7. A method of determining a self-initializing frequency divider architecture comprising the steps of:

providing a circuit comprising a series combination of memory elements forming a closed loop system and an end memory element having selection elements interposed between the memory elements wherein an output of the end memory element is received by each of the selection elements, selecting a frequency division factor of N+1, determining a control word to configure respective selection element and memory element combinations as one of a type selected from the group consisting of a re-circulating element, a pass element, and a feedback element that is consistent with the selected frequency division factor, programming the circuit with the control word, identifying a first control word that produces a self-initializing divide by N frequency divider, and determining if a second control word that converts a feedback element closest to said end memory element to a pass memory element results in a self-initializing frequency divider and if it does not, establishing a third control word that adds an additional feedback memory element interposed between said re-circulating memory element and the feedback element.

* * * * *

UNITED STATES PATENT AND TRADEMARK OFFICE
CERTIFICATE OF CORRECTION

| | | |
|---|---|---|
| PATENT NO. | : 7,268,597 B2 | Page 1 of 1 |
| APPLICATION NO. | : 11/058767 | |
| DATED | : September 11, 2007 | |
| INVENTOR(S) | : Robert Miller | |

It is certified that error appears in the above-identified patent and that said Letters Patent is hereby corrected as shown below:

Col. 8 Line 57 In Claim 1, after "element" insert -- to --.

Signed and Sealed this

Twenty-fourth Day of February, 2009

JOHN DOLL
*Acting Director of the United States Patent and Trademark Office*